US007484423B2

(12) United States Patent
Hakey et al.

(10) Patent No.: US 7,484,423 B2
(45) Date of Patent: Feb. 3, 2009

(54) INTEGRATED CARBON NANOTUBE SENSORS

(75) Inventors: Mark C. Hakey, Fairfax, VT (US); Mark E. Masters, Essex Junction, VT (US); Leah M. P. Pastel, Essex Junction, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/696,370

(22) Filed: Apr. 4, 2007

(65) Prior Publication Data

US 2007/0197010 A1 Aug. 23, 2007

Related U.S. Application Data

(62) Division of application No. 10/711,083, filed on Aug. 20, 2004, now Pat. No. 7,247,877.

(51) Int. Cl.
*G01B 7/16* (2006.01)
*G01L 1/00* (2006.01)
*H01L 29/06* (2006.01)
(52) U.S. Cl. ........................... 73/779; 257/24
(58) Field of Classification Search ............... 73/772, 73/779; 257/24
See application file for complete search history.

(56) References Cited

U.S. PATENT DOCUMENTS

| | | | |
|---|---|---|---|
| 5,383,194 A * | 1/1995 | Sloan et al. ............... 714/724 |
| 6,043,662 A * | 3/2000 | Alers et al. ............... 324/520 |
| 6,043,689 A | 3/2000 | Sheets, II et al. |
| 6,437,329 B1 | 8/2002 | Yedur et al. |
| 6,630,772 B1 | 10/2003 | Bower et al. |
| 6,777,960 B2 | 8/2004 | Unger |
| 6,848,320 B2 * | 2/2005 | Miyajima et al. ............ 73/763 |
| 6,852,582 B2 | 2/2005 | Wei et al. |
| 6,982,903 B2 | 1/2006 | Bertin et al. |
| 7,105,851 B2 * | 9/2006 | Dubin ....................... 257/24 |
| 7,186,380 B2 * | 3/2007 | Chen et al. ............... 422/82.01 |

(Continued)

FOREIGN PATENT DOCUMENTS

| | | |
|---|---|---|
| JP | 2003-142679 | 5/2003 |
| WO | WO 02/31183 A1 | 4/2002 |

OTHER PUBLICATIONS

Hepp et al., "Light-Emitting Field-Effect Transistor Bases on a Tetracene Thin Film", The American Physical Society, Physical Review Letters, vol. 91, No. 15, Oct. 10, 2003.

Primary Examiner—Edward Lefkowitz
Assistant Examiner—Octavia Davis
(74) Attorney, Agent, or Firm—Gibb & Rahman, LLC; Michael LeStrange, Esq.

(57) ABSTRACT

A method and structure for an integrated circuit comprising a first transistor and an embedded carbon nanotube field effect transistor (CNT FET) proximate to the first transistor, wherein the CNT FET is dimensioned smaller than the first transistor. The CNT FET is adapted to sense signals from the first transistor, wherein the signals comprise any of temperature, voltage, current, electric field, and magnetic field signals. Moreover, the CNT FET is adapted to measure stress and strain in the integrated circuit, wherein the stress and strain comprise any of mechanical and thermal stress and strain. Additionally, the CNT FET is adapted to detect defective circuits within the integrated circuit.

19 Claims, 4 Drawing Sheets

U.S. PATENT DOCUMENTS

| | | | |
|---|---|---|---|
| 7,256,063 B2 * | 8/2007 | Pinkerton et al. | 438/53 |
| 7,312,096 B2 * | 12/2007 | Kurtz | 438/50 |
| 2001/0023986 A1 | 9/2001 | Mancevski | |
| 2003/0142679 A1 | 7/2003 | Okagawa et al. | |
| 2003/0218224 A1 | 11/2003 | Schlaf et al. | |
| 2006/0054922 A1 | 3/2006 | Pettit | |

* cited by examiner

INTEGRATED CARBON NANOTUBE SENSORS

CROSS-REFERENCE TO RELATED APPLICATIONS

This application is a divisional of U.S. application Ser. No. 10/711,083 filed Aug. 20, 2004 now U.S. Pat. No. 7,247,877, the complete disclosure of which, in its entirety, is herein incorporated by reference.

BACKGROUND OF THE INVENTION

1. Field of the Invention

The embodiments of the invention generally relate to integrated circuit technology, and more particularly to devices and techniques for evaluating operation parameters of integrated circuit chips.

2. Description of the Related Art

In the integrated circuit industry, it is imperative to monitor the operation of an integrated circuit for control, testing, and/or diagnostic purposes. Conventionally, signals are made either internally using electrical readouts (e.g., diagnostic circuits, latches, scan chains, and related structures), or remotely using physical sensors (e.g., charge coupling device (CCD) detectors, thermal imagers, and magnetic field sensors). Unfortunately, electrical readout circuitry generally occupies valuable chip area, induces performance degradation or load to critical circuits on the chip, and cannot specifically pinpoint the location of problems.

Furthermore, remote sensing using physical sensors from the front side of chips is typically blocked by metal wiring and surface interconnects or input/output (I/O) devices. From the back side, signals tend to be severely attenuated by the silicon substrate and blocked by metal wiring as from the front side. Moreover, remote sensors are also generally lacking with regard to spatial resolution, where the best case has shown to be approximately on the order of one micron, which is already ten times greater than the minimum integrated circuit features.

Therefore, there remains a need for a novel structure and method for monitoring the operation of an integrated circuit during operation, which further provides enhanced resolution qualities, is operable at the wafer level or on packaged parts, does not occupy significant chip area, and does not negatively impact circuit and/or device performance.

SUMMARY OF INVENTION

In view of the foregoing, an embodiment of the invention provides an integrated circuit comprising a device to be monitored and a carbon nanotube field effect transistor (CNT FET) proximate to the device to be monitored. The CNT FET is adapted to sense signals from the first transistor, wherein the signals comprise any of temperature, voltage, current, electric field, and magnetic field signals. Moreover, the CNT FET is adapted to measure stress and strain in the integrated circuit, wherein the stress and strain comprise any of mechanical and thermal stress and strain. Additionally, the CNT FET is adapted to detect defective circuits within the integrated circuit. According to an embodiment of the invention, the device to be monitored comprises a transistor configured in a metal oxide semiconductor configuration. Furthermore, according to an embodiment of the invention, the device to be monitored comprises a gate; a source region; a drain region; and a gate insulator layer separating the gate from each of the source region and the drain region. Moreover, the CNT FET comprises a CNT FET gate; a CNT FET source region; a CNT FET drain region; and a carbon nanotube separating the CNT FET source region and the CNT FET drain region. According to an alternate embodiment, the gate of the device to be monitored and the CNT FET gate comprise a shared structure. According to another embodiment, the source region of the device to be monitored and the CNT FET source region comprise a shared structure. Also, the device to be monitored comprises any of a field effect transistor, a diode, a wire, a via, a resistor, an inductor, and a capacitor.

Another aspect of the invention provides an integrated circuit comprising a primary transistor and an embedded CNT FET spaced apart from the primary transistor, wherein the CNT FET is adapted to sense signals from the primary transistor, wherein the signals comprise any of temperature, voltage, current, electric field, and magnetic field signals. Additionally, the CNT FET is adapted to measure stress and strain in the integrated circuit, wherein the stress and strain comprise any of mechanical and thermal stress and strain. Furthermore, the CNT FET is adapted to detect defective circuits within the integrated circuit. According to an embodiment of the invention, the primary transistor comprises a metal oxide semiconductor configuration. In one embodiment of the invention, the primary transistor comprises a gate; a source region; a drain region; and a gate insulator layer separating the gate from each of the source region and the drain region. Moreover, the CNT FET comprises a CNT FET gate; a CNT FET source region; a CNT FET drain region; and a carbon nanotube separating the CNT FET source region and the CNT FET drain region. According to an alternate embodiment, the gate of the primary transistor and the CNT FET gate comprise a shared structure. According to another embodiment, the source region of the primary transistor and the CNT FET source region comprise a shared structure. Additionally, the primary transistor comprises any of a field effect transistor, a diode, a wire, a via, a resistor, and a capacitor.

Another aspect of the invention provides a method of evaluating operating parameters of an integrated circuit, wherein the method comprises forming a primary transistor in the integrated circuit, embedding a CNT FET in the integrated circuit, operating the primary transistor, and detecting signals of the primary transistor using the CNT FET, wherein the signals comprise any of temperature, voltage, current, electric field, and magnetic field signals. The method further comprises measuring stress and strain in the integrated circuit using the CNT FET, wherein the stress and strain comprise any of mechanical and thermal stress and strain. Additionally, the method comprises detecting defective circuits within the integrated circuit using the CNT FET. Furthermore, the step of forming comprises configuring the primary transistor in any of a field effect transistor, a diode, a wire, a via, a resistor, an inductor, and a capacitor configuration.

According to the embodiments of the invention, the CNT FET has enhanced resolution qualities, has the capability of being operable at both the wafer level or on packaged parts, is configured small enough such that it does not occupy significant chip area, and is configured such that it does not negatively impact circuit and/or device performance. The embodiments of the invention may be incorporated in microprocessors, application-specific integrated circuits, SRAM configurations, arrays of memory cells, macros, cores, and digital or analog circuit elements that have a known physical design for detection of specific defects or specific characterization of the circuit element. For example, the embodiments of the invention may be used for power use analysis, thermal characterization, IDD, critical path analysis, as well as other on-chip testing and diagnostic parameters affecting device performance.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF DRAWINGS

The embodiments of the invention will be better understood from the following detailed description with reference to the drawings, in which.

DETAILED DESCRIPTION

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel structure and method for monitoring the operation of an integrated circuit during operation. The embodiments of the invention achieve this need by providing a carbon nanotube field effect transistor (CNT FET) capable of being embedded as a diagnostic sensor in a complimentary metal oxide semiconductor (CMOS) integrated circuit. Referring now to the drawings, and more particularly to FIGS. 1 through 8, there are shown preferred embodiments of the invention. FIGS. 1 through 7 and the descriptions therein, refer to individual CMOS or CNT devices. However, for ease of understanding only one transistor is illustrated in each of FIGS. 1 through 7. Moreover, those skilled in the art would readily understand how the devices shown in FIGS. 1 through 7 would extend to more complete integrated circuit configurations.

Figures 1, 2:
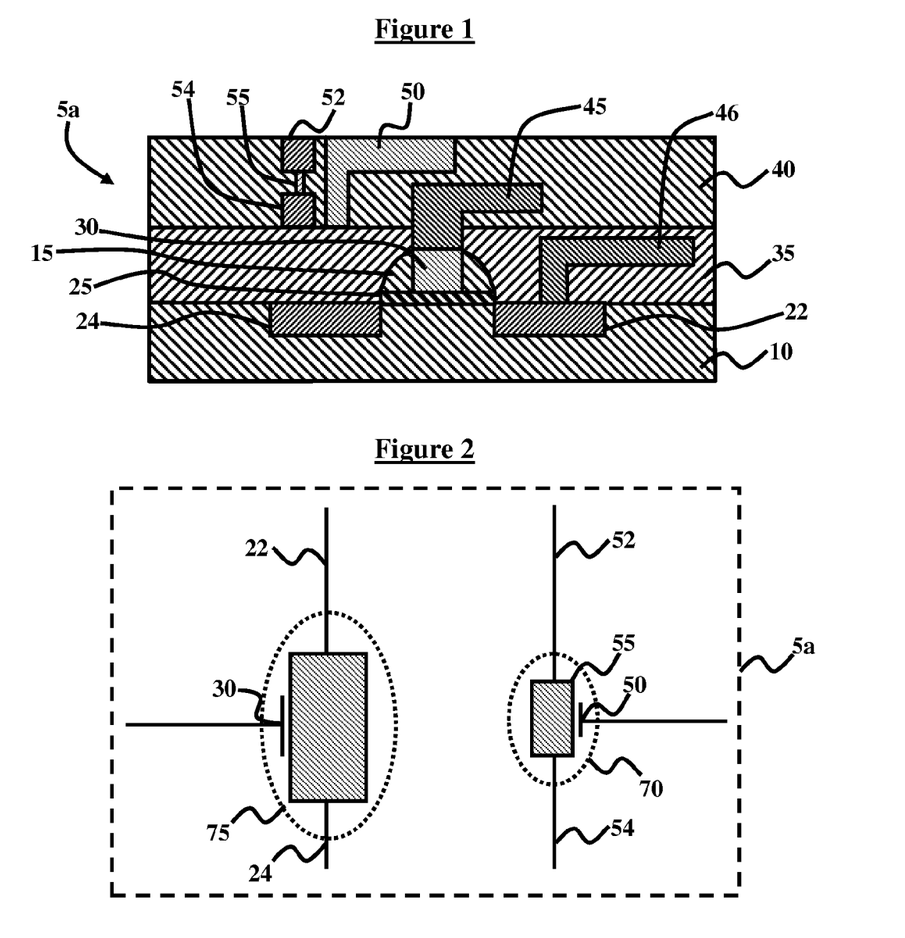
FIG. 1 is a cross-sectional diagram of a portion of an integrated circuit having an integrated carbon nanotube sensor device according to a first embodiment of the invention.
FIG. 2 is a circuit diagram of the devices of FIG. 1.

FIG. 1 illustrates a first embodiment of the invention whereby a CNT FET is integrated as a sensor in a CMOS device. The portion of the integrated circuit 5a comprises a silicon wafer 10 with source 24 and drain 22 diffusion regions implanted in the silicon wafer 10. A gate insulator layer 25, for example a nitride oxide, is then grown over the silicon wafer 10 including a portion in between the source 24 and drain 22 regions. Thereafter, a gate 30 is configured over the gate insulator layer 25. A contact and via/metal interconnect structure 45 is then connected to the gate 30. Additionally, a contact and via/ metal interconnect structure 46 is connected to the drain 22. A first interlevel dielectric layer 35 is formed over the gate 30 and adjacent to the gate insulator layer 25 and side portions of the raised source 24 and drain 22 regions. Furthermore, spacers 15 are formed surrounding the gate 30.

Next, a CNT FET sensor device is formed using any conventional technique, such as that described in U.S. Patent Publications US 2003/0218224A1 and US 2001/0023986A1, the complete disclosures of which, in their entirities, are herein incorporated by reference, wherein the CNT FET sensor device comprises a source 54 and drain 52 region with a nanotube 55 disposed therebetween and a gate 50 positioned proximate to the source 54/drain 52/nanotube 55 portion of the CNT FET. As such, the corresponding vertical CNT FET gate 50 is placed in proximity to the grown CNT channel. The gate 50 may be comprised of existing metal fill shapes. The CNT FET is held at a fixed bias such that changes in its channel current are due only to local temperature, voltage, current, electric field, and magnetic field gradients.

A second interlevel dielectric layer 40 is formed over the first interlevel dielectric layer 35, and surrounds the CNT FET source 54, drain 52, gate 50, and nanotube 55. While the figures illustrate a generally vertical source 54/drain 52/gate 50/nanotube 55 portion of the CNT FET, those skilled in the art would readily understand incorporating any configuration, including a horizontal configuration.

Figure 3:
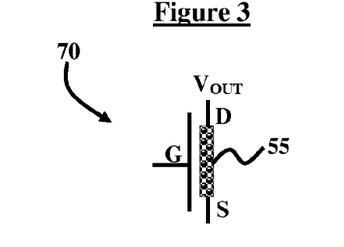
FIG. 3 is a circuit diagram of a carbon nanotube transistor device used in conjunction with the embodiments of the invention.

FIG. 2 further illustrates the integrated circuit 5a, wherein the CMOS FET device 75 comprises a gate 30, source 24, and drain 22. Similarly, the CNT FET device 70 comprises a gate 50, source 54, and drain 52, and a nanotube 55 between the source 54 and drain 52. As shown in FIGS. 1 and 2, the CNT FET device 70 is configured as a parasitic device to the CMOS device 75 without electrical connection therebetween. FIG. 3 illustrates the CNT FET device 70 of FIG. 2 in more physical detail.

Figure 4:
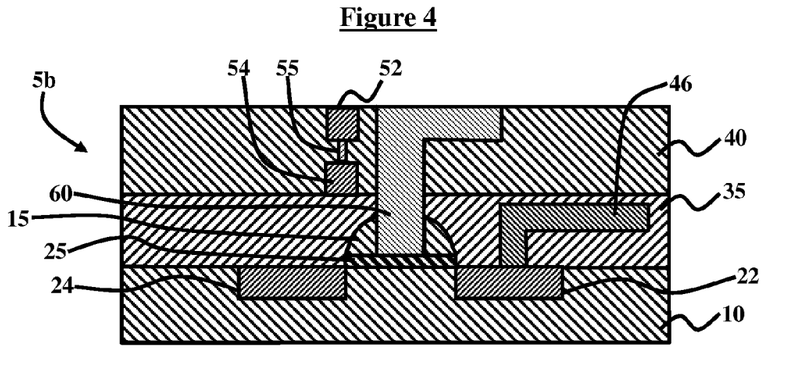
FIG. 4 is a cross-sectional diagram of an integrated carbon nanotube sensor device according to a second embodiment of the invention.
Figure 5:
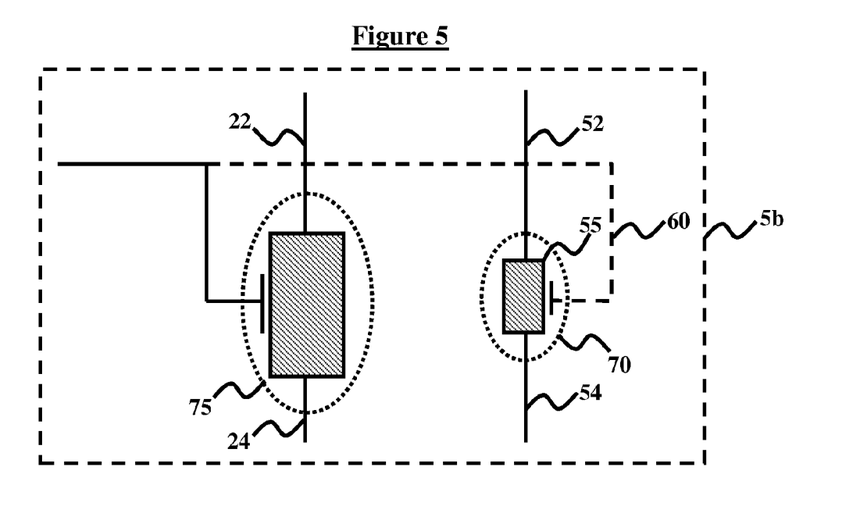
FIG. 5 is a circuit diagram of the devices of FIG. 5.

FIGS. 4 and 5 illustrate a second embodiment of the invention, which is embodied similar to the first embodiment, and as such like reference numerals in FIGS. 1-2 and 4-5 correspond to like components in the schematics. The difference between the first embodiment and the second embodiment is that the integrated circuit 5b of the second embodiment includes a common gate 60 for the CMOS device 75 and CNT FET device 70.

Figure 6:
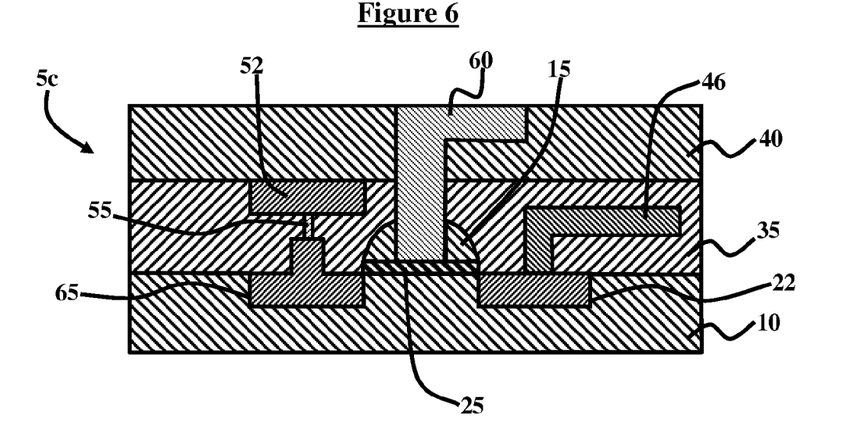
FIG. 6 is a cross-sectional diagram of an integrated carbon nanotube sensor device according to a third embodiment of the invention.
Figure 7:
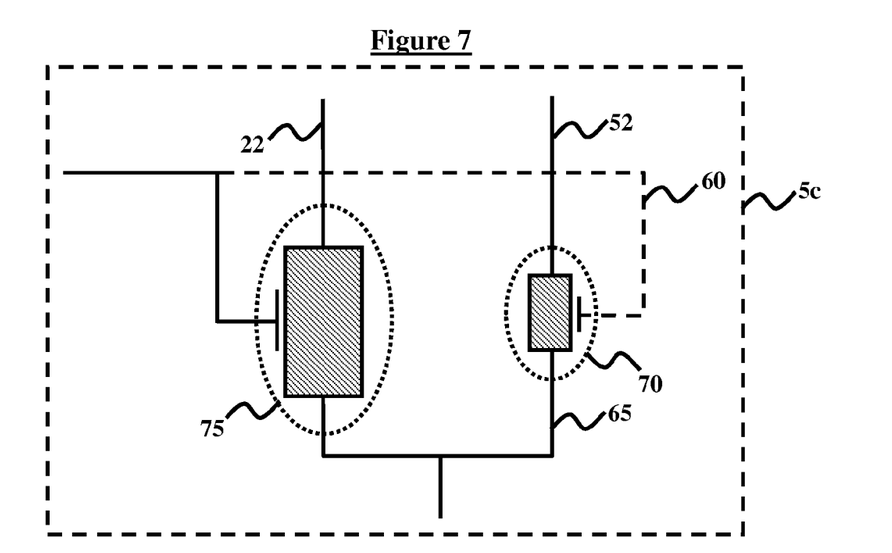
FIG. 7 is a circuit diagram of the devices of FIG. 7.

FIGS. 6 and 7 illustrate a third embodiment of the invention, which is embodied similar to the first and second embodiments, and as such like reference numerals in FIGS. 1-2, 4-5, and 6-7 correspond to like components in the schematics. The difference afforded by the third embodiment is that the integrated circuit 5c of the third embodiment includes a common gate 60 and common source 65 for the CMOS device 75 and CNT FET device 70. Thus, such a CNT FET device 70 could be placed in proximity to an existing CMOS signal path or gate stack, sharing the same gate electric field source, and hence act as a "follower device" wherein the signal driving the pre-existing CMOS device 75 could be monitored by the follower CNT FET device 70. Furthermore, the existing CMOS signals and gate voltage are monitored by the CNT FET 70, whereby the CNT FET device 70 shares its source 65 with the CMOS device source 65 and its gate 60 with the CMOS device gate 60. Hence the voltage on the CMOS device gate 60 simultaneously affects an electric field in both the CMOS device 75 and the CNT FET device 70 such that the electric field in the CNT FET device 70 is directly proportional to the signal appearing on the drain 52 of the CNT FET device 70.

According to the embodiments of the invention, the CNT FET device 70 serves as a temperature, voltage, current, electric field or magnetic field sensor for the CMOS device 75, wherein the local respective gradients in the CMOS device 75 are being sensed by the CNT FET device 70. Similarly, the CNT FET device 70 serves as a stress and strain sensor for the CMOS device 75, wherein the stress and strain present in the CMOS device 75 is being sensed by the CNT FET device 70. Furthermore, while two interlevel dielectric layers 35, 40 are shown, those skilled in the art would readily understand how fewer or greater number of interlevel dielectric and corresponding metal wiring layers could be used, with the CNT FET device formed in any of the interlevel dielectric and corresponding metal wiring layers.

By embedding the CNT FET devices 70 in an integrated circuit 5a, 5b, 5c that are many times smaller than critical features on the integrated circuit 5a, 5b, 5c, local measurement of key operating parameters, such as temperature, voltage, current, electric field, and magnetic field signals, with minimal chip area requirement and no electrical circuit degradation or loading is allowed. CNT FET devices 70 are preferably used as sensors due to their relatively small size, high sensitivity, and material compatibility with silicon CMOS integrated circuit films and processes. As described above, the CNT FET sensors 70 could be embedded in the CMOS processing using known methods in order to detect local changes in electric field, temperature, magnetic field, and related properties of interest during integrated circuit operation that facilitates in providing information about both normally functioning and defective circuits and regions of the integrated circuit chip 5a, 5b, 5c. Furthermore, the CNT FET sensors 70 are wired and interfaced to on-chip and/or off-chip circuitry using existing known methods and circuits.

According to the embodiments of the invention, the CNT FET device 70 is a field modulated device whereby the conductive properties of the carbon nanotube 55 are controlled by the electric field present and are further dependent upon temperature, magnetic field, stress, and strain. Therefore, the CNT FET 70 is positioned close enough to the device being monitored 75 that the signals passing through the CNT FET 70 will be affected by any significant electronic field, magnetic field, change in temperature, stress, strained, exerted by the adjacent device or transistor 75. Further, in alternative embodiments, the CNT FET 70 is spaced far enough away from the device being monitored 75 that the CNT FET 70 does not affect the operation of the device being monitored 75. The exact positioning of the CNT FET 70 with respect to the device being monitored 75 will vary from design to design and will also vary depending upon how closely the adjacent device 75 needs to be monitored, in that the closer the CNT FET 70 is placed to the device being monitored 75, the more likely that the fields, stresses, etc. exerted by the device being monitored will affect the signals passing through the CNT FET 70. The electric field, temperature, magnetic field, stress, and strain are affected not only by normal operation of the proximate CMOS device 75, but also by various defects within the nearby circuitry. Connecting the CNT FET 70 to appropriate measurement and amplification circuitry would thereby provide signals indicating the occurrence of such conditions.

Figure 8:
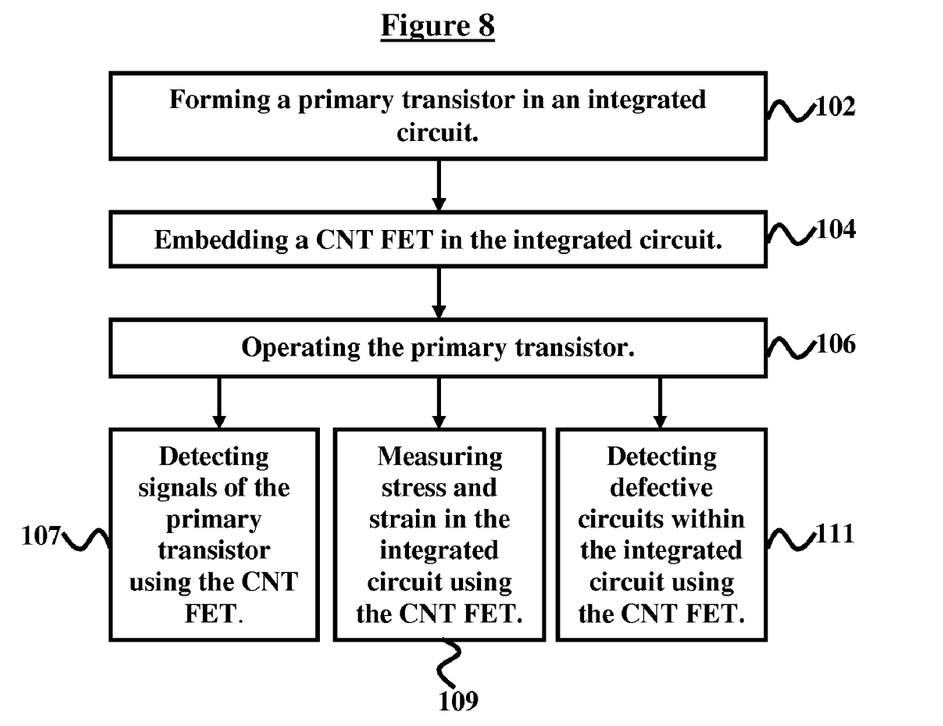
FIG. 8 is a flow diagram illustrating a preferred method of an embodiment of the invention.

FIG. 8 (in accordance with the embodiments and components shown in FIGS. 1 though 7) illustrates a method of evaluating operating parameters of an integrated circuit 5a, 5b, 5c, wherein the method comprises forming (102) a primary transistor 75 in the integrated circuit 5a, 5b, 5c; embedding (104) a CNT FET 70 in the integrated circuit 5a, 5b, 5c; operating (106) the primary transistor 75; and detecting (107) signals of the primary transistor 75 using the CNT FET 70, wherein the signals comprise any of temperature, voltage, current, electric field, and magnetic field signals. The method further comprises measuring (109) stress and strain in the integrated circuit 5a, 5b, 5c using the CNT FET 70, wherein the stress and strain comprise any of mechanical and thermal stress and strain. Additionally, the method comprises detecting (111) defective circuits within the integrated circuit 5a, 5b, 5c using the CNT FET 70. Furthermore, the step of forming (102) comprises configuring the primary transistor 75 in any of a field effect transistor, a diode, a wire, a via, a resistor, an inductor, and a capacitor configuration.

The CNT FET 70 may be used as a sensor as part of a power management system. Specifically, the CNT FET 70 may be used to determine when a region in the integrated circuit chip 5a, 5b, 5c requires additional power paths/connections to that region. Moreover, the CNT FET 70 may be used to determine whether a region in the integrated circuit chip 5a, 5b, 5c requires a reduction in the power paths/connections to that region. Furthermore, the CNT FET 70 may be used to measure the current/voltage in the power distribution within the integrated circuit chip 5a, 5b, 5c and to determine when the need arises to refresh standby/sleeping circuitry.

Insofar as stress/strain can affect device performance, as well as lead to dislocations that affect device functionality, the CNT FET 70 in combination with the primary FET 75 provides detection of areas within the integrated circuit 5a, 5b, 5c which are subject to elevated stress/strain levels which may result in device degradation and/or failure.

Generally, the invention provides an integrated circuit 5a, 5b, 5c comprising a first (or primary) transistor 75 and an embedded carbon nanotube field effect transistor 70 in proximity to (or alternatively, spaced apart from) the first (or primary) transistor 75, wherein the CNT FET 70 is dimensioned smaller than the first (or primary) transistor 75. The CNT FET 70 is adapted to sense signals from the first (or primary) transistor 75, wherein the signals comprise any of temperature, voltage, current, electric field, and magnetic field signals. Moreover, the CNT FET 70 is adapted to measure stress and strain in the integrated circuit 5a, 5b, 5c, wherein the stress and strain comprise any of mechanical and thermal stress and strain.

Additionally, the CNT FET 70 is adapted to detect defective circuits within the integrated circuit 5a, 5b, 5c. According to one embodiment, the first (or primary) transistor 75 comprises a metal oxide semiconductor configuration. Furthermore, the first (or primary) transistor 75 comprises a gate 30, a source region 24, a drain region 22, and a gate oxide layer 25 separating the gate 30 from each of the source region 24 and the drain region 22. Moreover, the CNT FET 70 comprises a CNT FET gate 50, a CNT FET source region 54, a CNT FET drain region 52, and a carbon nanotube 55 separating the CNT FET source region 54 and the CNT FET drain region 52. According to one embodiment, the gate of the first (or primary) transistor 30 and the CNT FET gate 50 comprise a shared (same) structure 60. According to another embodiment, the source region of the first (or primary) transistor 24 and the CNT FET source region 54 comprise a shared (same) structure 65.

The embodiments of the invention may be incorporated in microprocessors, application-specific integrated circuits, SRAM configurations, arrays of memory cells, macros, cores, and digital or analog circuit elements that have a known physical design for detection of specific defects or specific characterization of the circuit element. For example, the embodiments of the invention may be used for power use analysis, thermal characterization, IDD, critical path analysis, as well as other on-chip testing and diagnostic parameters affecting device performance.

According to the embodiments of the invention, the CNT FET 70 has enhanced resolution qualities because the dimension of the CNT FET 70 itself being substantially smaller than that of the CMOS device 75 in which it is embedded allows problems to be localized to the specific location of the CNT FET 70 with a spatial resolution on the order of the size of the CNT FET 70. Additionally, the CNT FET 70 has the capability of being operable at both the wafer level or on packaged parts as it is embedded within and uses circuitry inherent in the original CMOS integrated circuit 5a, 5b, 5c. Moreover, the CNT FET 70 is configured small enough such that it does not occupy significant chip area due to the substantially smaller diameter of FETs attainable with carbon nanotube technology as compared with the transistors and interconnecting conductors of CMOS devices 75. Furthermore, the CNT FET 70 is configured such that it does not negatively impact circuit and/or device performance because the CNT FET 70 is only passively coupled by temperature, electric field, magnetic field, stress, or strain to the devices and circuits which it is monitoring.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. For example, while the drawings and descriptions illustrate the first (or primary) transistor in a field effect transistor, the embodiments of the invention are equally applicable to other transistor and circuit configurations including, but not limited to, a a diode, a wire, a via, a resistor, an inductor, and a capacitor configuration. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of evaluating operating parameters of an integrated circuit, said method comprising:
   providing a primary transistor in said integrated circuit;
   embedding a carbon nanotube field effect transistor (CNT FET) in said integrated circuit,
      wherein a nanotube portion of said CNT FET is separate from said primary transistor;
   operating said primary transistor;
   detecting signals from said CNT FET corresponding to said operating parameters of said primary transistor in said integrated circuit; and
   detecting defective circuits within said integrated circuit by measuring stress and strain of said primary transistor in said integrated circuit using said CNT FET,
      wherein said stress and strain comprise any of mechanical and thermal stress and strain.

2. The method of claim 1, wherein in the process of detecting signals, said signals comprise any of temperature, voltage, current, electric field, and magnetic field signals.

3. The method of claim 1, further comprising measuring physical characteristics in said integrated circuit using said CNT FET.

4. The method of claim 1, wherein the providing process comprises configuring said primary transistor in any of a field effect transistor, a diode, a wire, a via, a resistor, an inductor, and a capacitor configuration.

5. The method of claim 1, wherein said primary transistor comprises:
   a gate;
   a source region;
   a drain region; and
   a gate insulator separating said gate from each of said source region and said drain region.

6. The method of claim 1, wherein said CNT FET comprises:
   a CNT FET gate;
   a CNT FET source region;
   a CNT FET drain region; and
   said nanotube portion separating said CNT FET source region and said CNT FET drain region.

7. A method of evaluating operating parameters of an integrated circuit, said method comprising:
   providing a primary transistor in said integrated circuit;
   embedding a carbon nanotube field effect transistor (CNT FET) in said integrated circuit,
      wherein a nanotube portion of said CNT FET is separate from said primary transistor;
   measuring physical characteristics, corresponding to said operating parameters of said primary transistor of said integrated circuit, using said CNT FET; and
   measuring stress and strain of said primary transistor in said integrated circuit using said CNT FET, wherein said stress and strain comprise any of mechanical and thermal stress and strain.

8. The method of claim 7, further comprising using said CNT FET to sense signals corresponding to said operating parameters of said primary transistor, wherein said signals comprise any of temperature, voltage, current, electric field, and magnetic field signals.

9. The method of claim 7, further comprising using said CNT FET to detect defective circuits within said integrated circuit.

10. The method of claim 7, further comprising configuring said primary transistor in a metal oxide semiconductor configuration.

11. The method of claim 7, further comprising configuring said primary transistor in a field effect transistor configuration.

12. The method of claim 7, wherein said primary transistor comprises:
   a gate;
   a source region;
   a drain region; and
   a gate insulator layer separating said gate from each of said source region and said drain region.

13. The method of claim 7, wherein said CNT FET comprises:
   a CNT FET gate;
   a CNT FET source region;
   a CNT FET drain region; and
   said nanotube portion separating said CNT FET source region and said CNT FET drain region.

14. A method of manufacturing an integrated circuit, said method comprising:
  placing a primary transistor in said integrated circuit; and
  embedding a carbon nanotube field effect transistor (CNT FET) in said integrated circuit,
    wherein a nanotube portion of said CNT FET is separate from said primary transistor,
    wherein said CNT FET is configured to measure physical characteristics corresponding to operating parameters of said primary transistor of said integrated circuit
  wherein said primary transistor comprises:
    a gate;
    source and drain regions; and
    a gate insulator separating said gate from each of said source and drain regions,
  wherein said CNT FET comprises:
    a CNT FET gate:
    CNT FET source and drain regions; and
    said nanotube portion separating the CNT FET source region and the CNT FET drain region.

15. The method of claim 14, wherein said gate of said primary transistor and said CNT FET gate comprise a shared structure.

16. The method of claim 14, wherein said source region of said primary transistor and said CNT FET source region comprise a shared structure.

17. The method of claim 14, wherein said CNT FET is configured to sense signals corresponding to said operating parameters of said primary transistor, wherein said signals comprise any of temperature, voltage, current, elective field, and magnetic field signals.

18. The method of claim 14, wherein said CNT FET is configured to measure stress and strain in said integrated circuit structure, wherein said stress and strain comprise any of mechanical and thermal stress and strain.

19. The method of claim 14, wherein said CNT FET is configured to detect defective circuits within said integrated circuit structure.

* * * * *